US010836095B2

United States Patent
Feuilloley et al.

(10) Patent No.: US 10,836,095 B2
(45) Date of Patent: Nov. 17, 2020

(54) DEHYDRATION CIRCUIT FOR AN ELECTROMAGNETIC PROCESSING UNIT OF HOLLOW BODIES

(71) Applicant: SIDEL PARTICIPATIONS, Octeville-sur-Mer (FR)

(72) Inventors: Guy Feuilloley, Octeville-sur-Mer (FR); Yoann Lahogue, Octeville-sur-Mer (FR)

(73) Assignee: SIDEL PARTICIPATIONS, Octeville-sur-Mer (FR)

( * ) Notice: Subject to any disclaimer, the term of this patent is extended or adjusted under 35 U.S.C. 154(b) by 217 days.

(21) Appl. No.: 15/838,649

(22) Filed: Dec. 12, 2017

(65) Prior Publication Data

US 2018/0162038 A1    Jun. 14, 2018

(30) Foreign Application Priority Data

Dec. 12, 2016  (EP) .................................... 16306667

(51) Int. Cl.
*B29C 49/64* (2006.01)
*B29C 49/78* (2006.01)
(Continued)

(52) U.S. Cl.
CPC ........ *B29C 49/783* (2013.01); *B29C 35/0805* (2013.01); *B29C 49/06* (2013.01); *B29C 49/4284* (2013.01); *B29C 49/6409* (2013.01); *B29C 49/6418* (2013.01); *B29C 49/786* (2013.01); *H05B 3/0057* (2013.01); *B29B 13/024* (2013.01); *B29C 2035/0822* (2013.01);
*B29C 2035/0838* (2013.01); *B29C 2049/067* (2013.01); *B29C 2049/5858* (2013.01);
(Continued)

(58) Field of Classification Search
CPC ............ B29C 49/6418; B29C 49/6409; B29C 2035/0838; H01S 5/42; H01S 5/423; H01S 5/426; H01S 5/02423
See application file for complete search history.

(56) References Cited

U.S. PATENT DOCUMENTS

| 6,361,301 B1 | 3/2002 | Scaglotti et al. |
| 2008/0099961 A1 | 5/2008 | Feuilloley et al. |

(Continued)

FOREIGN PATENT DOCUMENTS

| DE | 10 2005 061 334 A1 | 6/2007 |
| EP | 2 977 182 A1 | 1/2016 |

(Continued)

OTHER PUBLICATIONS

European Search Report, dated Jun. 7, 2017, from corresponding EP application No. 16 30 6667.

*Primary Examiner* — Robert B Davis (57) ABSTRACT

Disclosed is a processing unit for an electromagnetic processing of plastic parisons and including a series of processing modules, each including a hollow housing, a light emitting assembly and a dehydration circuit for preventing each hollow housing from moisture via a dehydrated fluid. The dehydration circuit extends outside the main body, where the circuit can be in fluid communication with a source of pressurized fluid, on which are disposed a fluid dehydration unit and fluid circulation unit for forcing the dehydrated fluid to feed the respective hollow housings.

20 Claims, 9 Drawing Sheets

(51) Int. Cl.
  *B29C 49/06*  (2006.01)
  *B29C 35/08*  (2006.01)
  *B29C 49/42*  (2006.01)
  *H05B 3/00*   (2006.01)
  *B29K 105/00*   (2006.01)
  *B29L 31/00*    (2006.01)
  *B29K 67/00*    (2006.01)
  *B29B 13/02*    (2006.01)
  *H01S 5/42*     (2006.01)
  *B29C 49/58*    (2006.01)

(52) U.S. Cl.
  CPC .. *B29K 2067/003* (2013.01); *B29K 2105/258* (2013.01); *B29L 2031/7158* (2013.01); *H01S 5/42* (2013.01)

(56) References Cited

U.S. PATENT DOCUMENTS

2016/0326963 A1* 11/2016 Yamazaki ............... F01D 25/32
2017/0215232 A1    7/2017 Feuilloley

FOREIGN PATENT DOCUMENTS

FR         3 024 069  A1    1/2016
WO         2016/012373 A1    1/2016

* cited by examiner

DEHYDRATION CIRCUIT FOR AN ELECTROMAGNETIC PROCESSING UNIT OF HOLLOW BODIES

FIELD OF THE INVENTION

The invention generally relates to the electromagnetic processing of hollow bodies made of plastic material, in order to heat such hollow bodies.

More specifically, the invention relates to an electromagnetic heating of parisons of containers (such as bottles, jars or flasks), performed by passing them through a processing unit, equipped with a plurality of sources of electromagnetic radiation.

The expression "parison" refers either to a preform, obtained by injecting and/or compressing a raw material into an injection mold, or to an intermediate container (or hollow body) obtained by blow molding a preform, which intermediate container requires a complementary thermal processing for some reason.

BACKGROUND OF THE INVENTION

One possible application is the heating of parisons under the form of preforms in view of forming containers by stretch blow molding the preforms, after they have been heated.

Although the conventional technique of heating parisons by means of tubular incandescent halogen lamps radiating according to Planck's law over a continuous spectrum is the most widely used to date, an alternative technology has emerged, based on the use of monochromatic or quasi-monochromatic radiation (such as lasers), emitting in the infrared range.

The performance and properties (particularly optical precision) of laser heating, which are superior to those of halogen heating, make it possible to achieve a faster and more selective heating of the parisons.

PCT application WO2016012373 (to Sidel Participations) discloses a processing unit for an electromagnetic processing of parisons made of thermoplastic material, said processing unit including a plurality of heating modules each provided preferably with a plurality of infrared sources.

More specifically, the processing unit of WO2016012373 includes:
a series of adjacent processing modules individually including:
  a main body comprising a hollow housing,
  a light emitting assembly disposed in said hollow housing and including a plurality of light emitting sources,
  a fluidic circuit provided within the main body for a thermal regulation of the light emitting assembly; and,
  a dehydration circuit for preventing each hollow housing from moisture via a dehydrated fluid.

In order to withdraw moisture from each hollow housing, WO2016012373 further discloses that each processing module may therefore include a desiccation chamber, which can be formed within an add-on case mounted on the rear face of the main body (the face opposite to the front face, on which the light is emitted).

To put the desiccation chamber into fluid communication with the front housing, the main body is provided with through holes. The desiccation chamber is at least partly filled with a desiccant, such as silica gel or any equivalent substance. Replacement of the saturated desiccant by fresh desiccant may be achieved through a removable cap, sealingly tightened to the add-on case.

Despite its performances, there is still a need for enhancing the efficiency of the processing unit. More precisely, problems of condensation can occur within the hollow housings because of the light emitting assemblies, which are to be maintained at a substantially constant temperature, typically by cooling.

Managing and controlling the moisture within the hollow housings receiving the light emitting assemblies is requested for preventing any electrical arc between metallic zones or walls, which are close from each other (minimal distance ~100 µm), and further limiting oxidation thereof.

Further, managing the moisture in the vicinity of the light emitting assemblies, by using a fluid in contact with a rechargeable desiccant, includes drawbacks:
the cartridge of desiccant must regularly be changed, when saturated;
each and every desiccation chamber must be provided with detectors adapted to check the moisture ratio and provide the user with data relating to said cartridge of desiccant, when saturated;
the efficiency of this solution depends on how the imperviousness of the desiccation chamber is, all the more since the chamber includes coolers inducing problems because of electrical connections, which must pass through the wall limiting the chamber.

SUMMARY OF THE INVENTION

It is an object of the invention to provide an electromagnetic processing unit having increased security.

It is another object of the invention to provide processing modules individually having an atmosphere around the light emitting assemblies, the moisture rate of which atmosphere is as low as possible, and possibly having low moisture rates in all the hollow housings in order to improve security.

It is yet another object of the invention to withdraw the drawbacks of the prior art.

It is therefore provided, according to a first aspect of the invention, a processing unit, in which, contrarily to what is disclosed in WO2016012373:
the dehydration circuit extends outside the main body, where said dehydration circuit can be in fluid communication with a source of fluid, on which are disposed fluid dehydration means, and,
fluid circulation means are provided, for forcing the dehydrated fluid to feed the respective hollow housings.

According to various embodiments or optional sub-features, taken either separately or in combination:
the dehydration circuit may comprise fluid distribution ducts disposed for feeding the processing modules with the dried pressurized fluid in parallel. As a consequence, all the hollow housings would then be commonly fed with the same fluid having a unique moisture ratio;
the processing modules may be in fluid communication with a fluid exhaust circuit, for exhausting the fluid downstream the processing modules. As a consequence, the dehydrated fluid within the hollow housings would then be renewed;
the processing modules may be in fluid communication with a fluid recycling circuit, so that said fluid circulates in a closed loop. This would be an economic and safe solution;
in such a case, the fluid recycling circuit, in which said fluid would circulate in a closed loop could comprise said fluid dehydration means and the so-called fluid circulation means. A dehydration step of the fluid in circulation in the loop could then be realized upon request.

in another solution, it is proposed that:
- the source of pressurized fluid delivers the fluid at a first pressure and,
- the fluid dehydration means and fluid circulation means comprise a fluid depressurization device for feeding the respective hollow housings with said dehydrated fluid at a second pressure lower than the first pressure. As detailed below, such a solution could be realized by using the pressurized fluid provided in a blow molding unit or a stretch blow molding unit for blowing parisons.

further and possibly, the fluid dehydration means may comprises an air dryer, for safety.

the processing unit further may comprises a fluid moisture measurement device, disposed on the dehydration circuit for measuring moisture, downstream the processing modules. This is valuable for safety, since it allows the user to easily check if moisture is still (too) high in the hollow housings;

the light emitting assembly having a length, each hollow housing could have an upright length and upper and lower longitudinal ends and at least some of the hollow housings could then include first and second through holes, located near the respective upper and lower longitudinal ends, for respectively feeding the first hole with, and exhausting from the second hole, said dehydrated fluid, so that the light emitting assembly be swept with said fluid longitudinally. This would be useful for safety since a longitudinal sweeping would then be provided. This solution would improve a removal of fluid condensates;

as an alternative to the above embodiments, at least some of the hollow housings could have through holes located near a common lower end of said hollow housing for respectively feeding it with, and exhausting therefrom, said dehydrated fluid, so that the light emitting assembly would then be swept with said fluid from one side. This solution would also be useful for safety since there would be a loop sweeping, which would improve mixing between the gaseous atmosphere and the dehydration fluid. Removal of fluid condensates would also be improved;

as an additional covering is also concerned by the present invention, an assembly comprising:
- the above-mentioned source of fluid,
- one of a blow molding unit and a stretch blow molding unit fed from said source of fluid with a pressurized fluid for blowing said parisons in said one of the blow molding unit and a stretch blow molding unit and,
- the above-described processing unit with all or part of its above-described features.

In other words, the circuit of dehumidified air of the blow molding unit or the stretch blow molding unit would then be used to feed each of the hollow housings with said dehumidified air (used as dehydrated fluid) and thus prevent efficiently said housings from moisture. Such a solution would be also useful for safety since the fluid, typically air, used for blowing fluid within the parisons is typically a food-grade fluid. Further high pressure is available accordingly (typically about $40 \times 10^5$ Pa); the only need would be to reduce said pressure as requested (typically about $1.5 \times 10^5$ Pa);

The above and other objects and advantages of the invention will become even more apparent if need still be from the detailed description of preferred embodiments, considered in conjunction with the following accompanying drawings.

BRIEF DESCRIPTION OF THE DRAWINGS

In the drawings:

FIG. 3 is a perspective, exploded front view of a processing module the processing unit of FIG. 1 is equipped with.

FIGS. 6, 7 and FIGS. 8, 9 are respectively two embodiments showing two possibilities of feeding with the dried (or dehydrated) fluid one of said hollow housings. FIGS. 7, 9 are cut views of one of the processing module of FIGS. 6, 8 taken along lines VII-VII, IX-IX, respectively.

DETAILED DESCRIPTION

Figure 1:
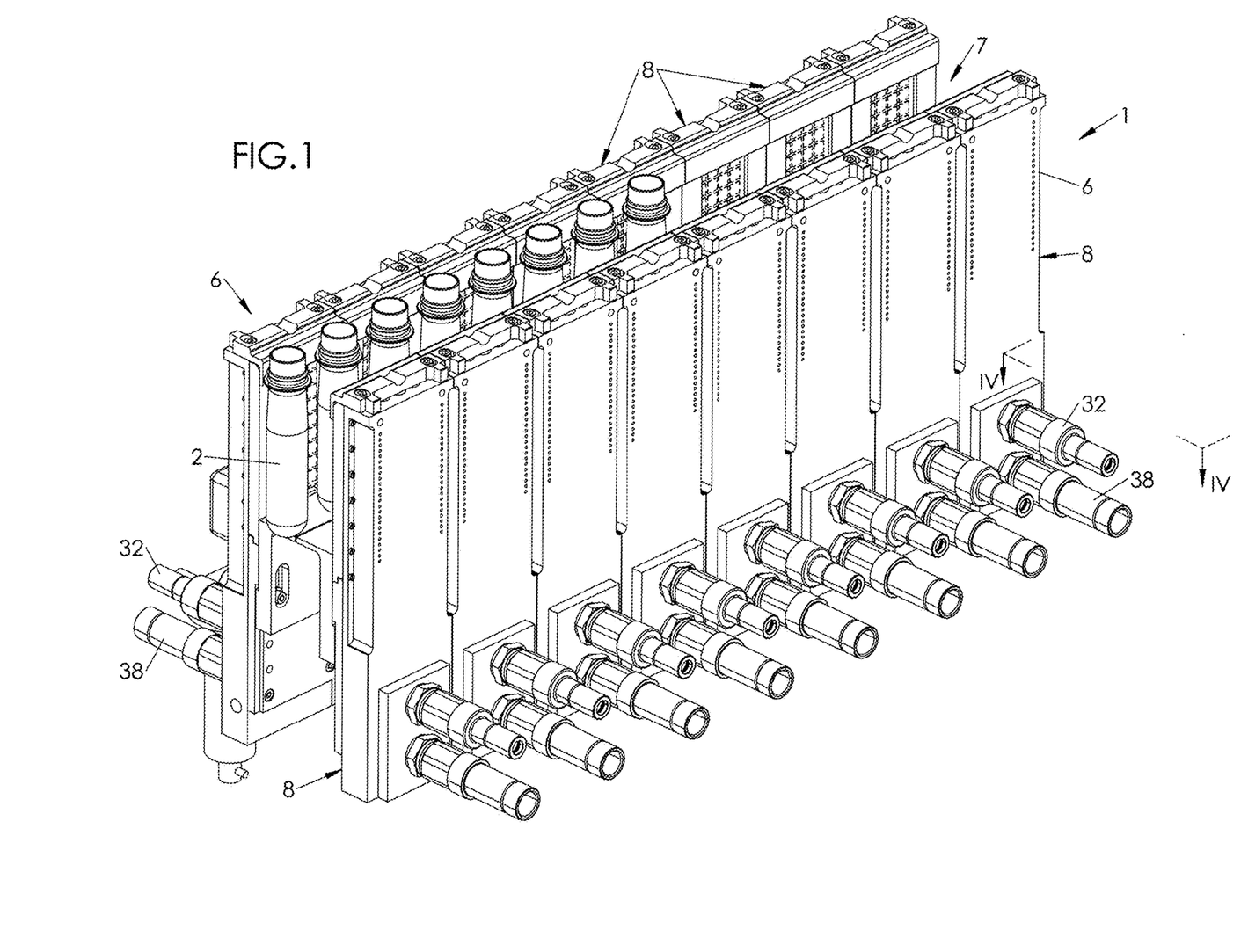
FIG. 1 is a perspective view of a processing unit for processing parisons, including a series of adjacent processing modules, showing only the connection holes used for the fluid communication between the hollow housings and the fluid feeding circuit used for providing the dried (or dehydrated) fluid.
Figure 2:
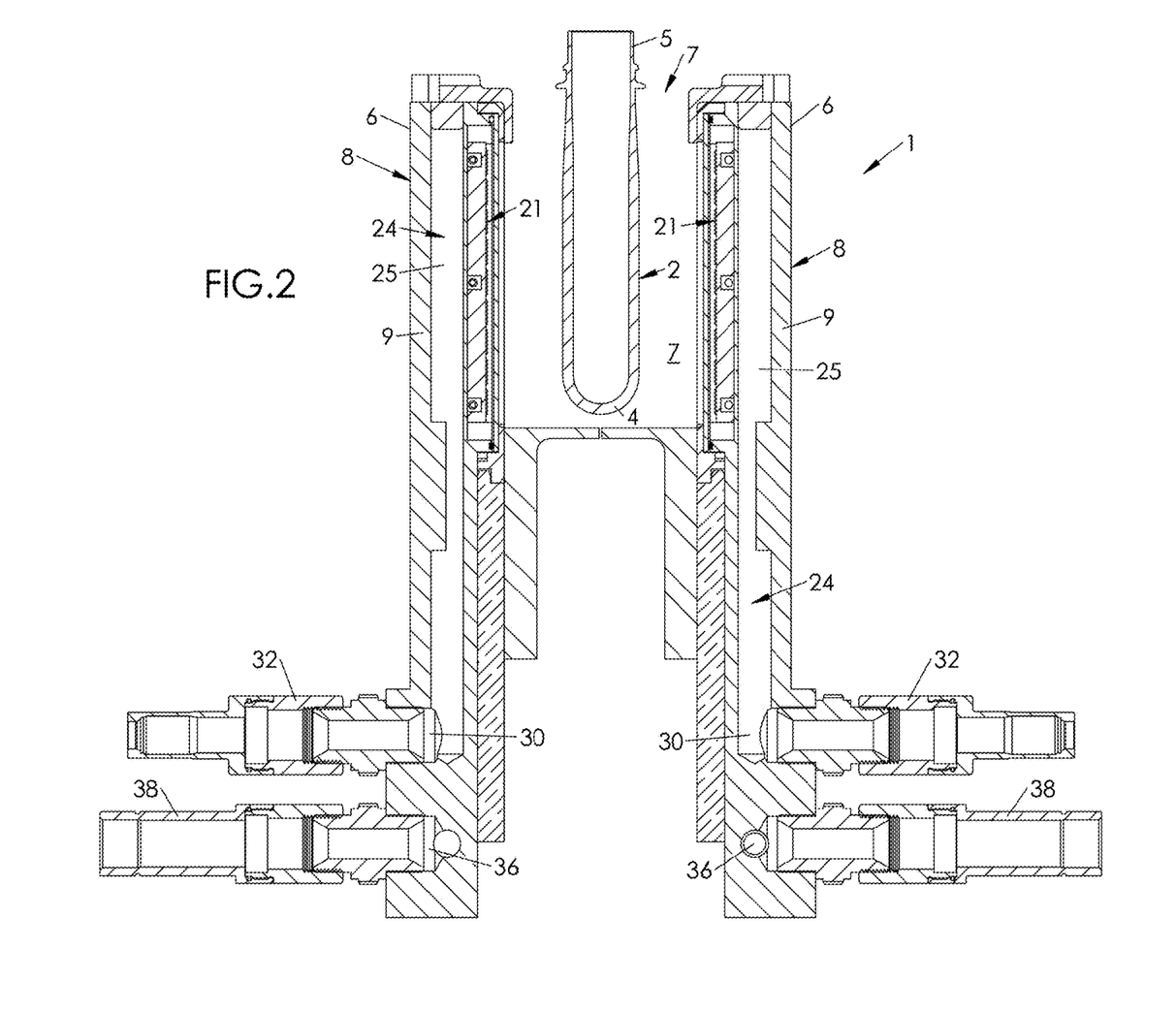
FIG. 2 is a transversal (vertical) cut view of the processing unit of FIG. 1.

Depicted on FIG. 1 and FIG. 2 is an electromagnetic processing unit 1 for the processing (such as the heating or the decontamination) of parisons 2 made of a plastic material. In the illustrated example, the parisons 2 are preforms (e.g. made of polyethylene terephthalate or PET) intended, when heated (and therefore softened), to undergo a blowing or stretch-blowing operation in a mold to form containers such as bottles or flasks.

The preform shown to depict a parison 2 has a substantially cylindrical body closed at one end by a bottom 4 and being extended, at an opposite end, by a neck 5, which neck is generally used to carry it and is open to form the mouth of the final container (as depicted on FIG. 1 and FIG. 2).

Instead of a preform, the parison 2 might be an intermediate container, already known, obtained during a previous blow molding or stretch blow molding step of a preform. Like a preform, such intermediate container would comprise a body closed at one end by a bottom 4 and being extended, at an opposite end, by a neck 5 (which is also the neck of the preform).

The processing unit 1 comprises a pair of parallel sidewalls 6 facing each other, which extend vertically along the path of the parisons 2, on either side thereof, and which together define a cavity 7, in which the parisons 2 pass.

At least one (and preferably each) sidewall 6 comprises a series of similar electromagnetic processing modules 8 mounted adjacent to one another.

Each processing module 8 includes a main body 9 preferably made of a single piece of a thermally conductive material, such as a steel alloy.

The processing module 8 further includes other components mounted on the main body 9, which therefore provides a support function for those components. The components are fixed to the main body 9 either directly or indirectly through interface elements.

Figure 3:
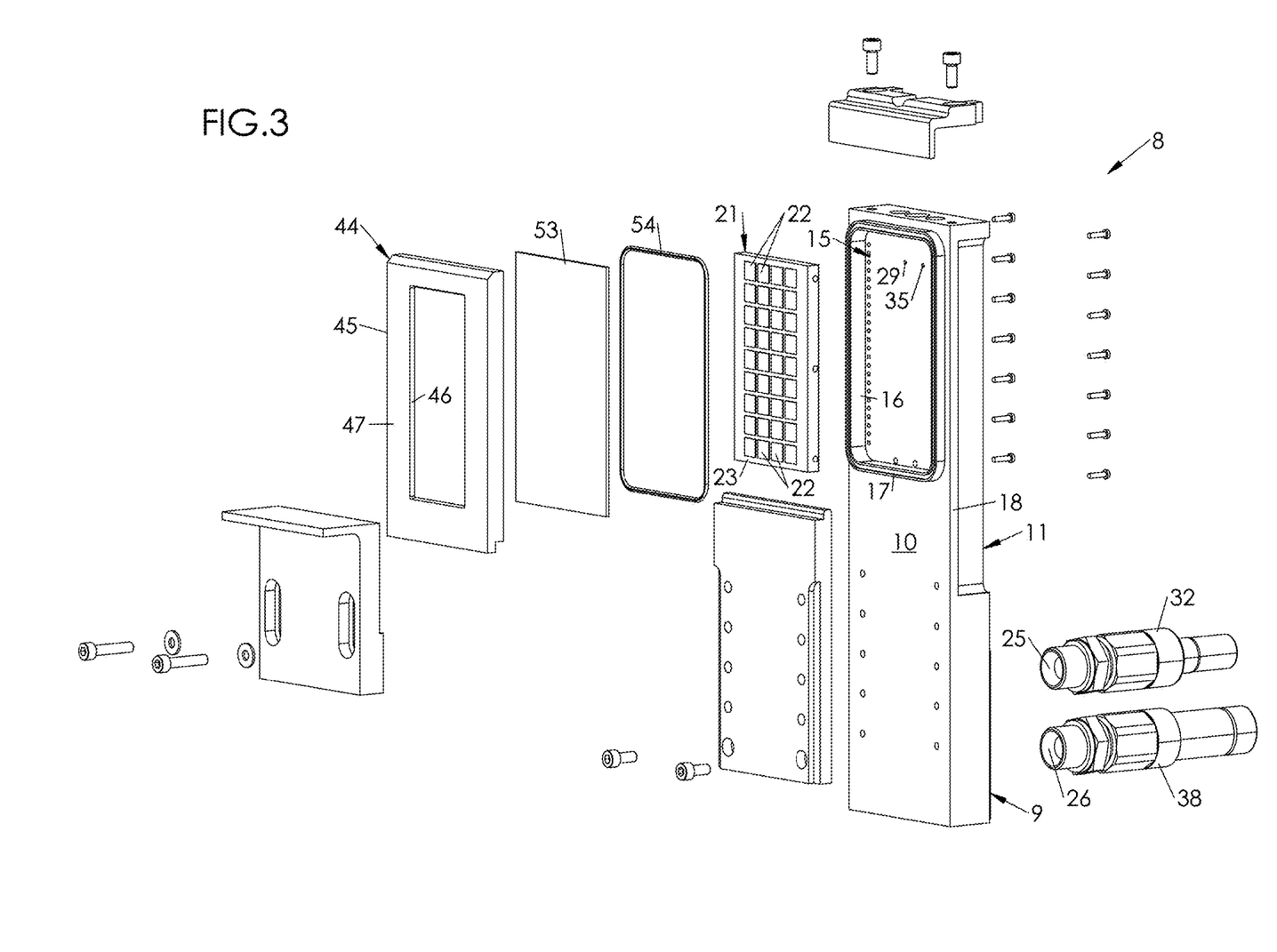

As depicted on FIG. 3, the main body 9 has a front face 10, which, in operation (see FIG. 1), is oriented towards the cavity 7, i.e. towards the parisons 2. The main body 9 also has a rear face 11 and a side face 18.

In the following, any surface oriented in the same direction as the front face 10 is described as oriented frontwards. On the contrary, any surface oriented in a direction opposite the front face 10 is described as oriented backwards.

In a preferred embodiment, the main body 9 comprises a hollow front housing 15 formed in the front face 10 adjacent the upper edge thereof. As depicted on FIG. 3, the front/hollow housing 15 is surrounded by a rib 16 protruding from the front face 10. A continuous groove 17 is formed in a front edge of the rib 16.

The processing module 8 also comprises a light emitting assembly 21 mounted onto the main body 9 and including a plurality of light emitting sources (each of microscopic dimensions and therefore not visible in the drawings).

In one embodiment, wherein the processing unit 1 is a heating unit designed for the thermal conditioning of the parisons 2 for manufacturing containers therefrom, the light emitting sources are designed for emitting in the infrared range. In another embodiment, wherein the processing unit 1 is a decontamination unit designed for the decontamination of the parisons 2, e.g. in view of a subsequent aseptic filling, the light emitting sources are designed for emitting in the ultraviolet range. Several wavelengths or ranges (such as infrared and ultraviolet) may also be combined.

In one embodiment, wherein the processing unit 1 is a heating unit, the light emitting sources may be infrared laser diodes.

One possible organization form of the light emitting sources is a matrix 22, as in the depicted example. The or each matrix 22 may be a matrix of vertical-cavity surface-emitting laser (VCSEL) diodes, known to provide a high density of sources (up to several tens or hundreds of thousands W per square inch).

In the depicted examples and more precisely in FIG. 3, the emitting assembly 21 comprises a plurality of such matrixes 22 mounted on a common (or splitted) substrate 23 and in turn organized to form a larger matrix.

The light emitting assembly 21 is such mounted onto the main body 9 as to radiate frontwards. Typically, the light emitting assembly 21 is received, preferably completely, in the front housing 15. The light emitting assembly 21 is tightly fixed to the main body.

In operation, the light emitting assembly 21 produces heat, which, if not removed, would decrease its efficiency. The light emitting assembly 21 therefore needs to be cooled and, more precisely, maintained to a substantially constant temperature.

To that end, the processing module 8 comprises a fluidic circuit 24 provided within the main body 9 for thermal regulation of the light emitting assembly 21. The cooling fluid may simply be pure water, but any other suitable fluid may be used.

Figure 4:
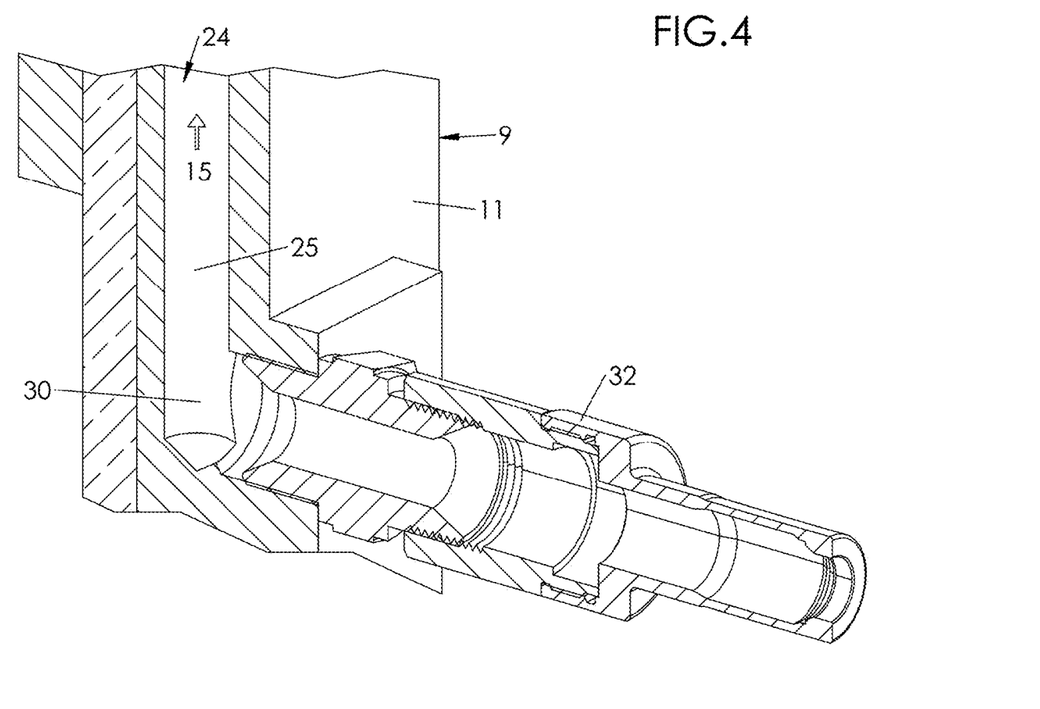
FIG. 4 is a perspective detail cut view of one of the processing module, taken along line IV-IV of FIG. 1.

In the depicted example, the fluidic circuit 24 comprises at least one intake channel 25 and at least one discharge channel 26 formed within respective intake nozzle 32 (as shown FIG. 4) and discharge nozzle 38, in the main body 9.

The intake channel 25 opens, on the one hand, in the front housing 15 through an intake hole 29 in the front face 10 (see FIG. 3). On the other hand, the intake channel 25 opens on the rear face 11 of the main body 9 through an inlet port 30. Preferably, several intake holes 29 may be drilled in the front face 10, thereby allowing high fluid rate and uniform cooling of the light emitting assembly 21.

Cooling fluid is supplied to the fluidic circuit 24 by an intake duct (not illustrated) via the intake nozzle 32 connected to the inlet port 30.

The or each discharge channel 26 extends within the main body 9 aside (and preferably parallel to) the intake channel 25, substantially to the same extent.

The discharge channel 26 opens, on the one hand, in the front housing 15 through a discharge hole 35 in the front face 10. On the other hand, the discharge channel 26 opens on the rear face 11 of the main body 9 through an outlet port 36. Preferably, several pairs of discharge holes 35 may be drilled in the front face 10 on each side of the intake holes 29.

The cooling fluid is discharged from the fluidic circuit 24 by a discharge duct (not illustrated) via the discharge nozzle 38.

In a preferred embodiment, the fluidic circuit 24 comprises a pair of discharge channels formed on each side of the intake channel 25.

Further, the light emitting assembly 21 will preferably be provided with a fluid distribution circuit formed within the substrate 23 to spread the fluid flow behind the matrixes 22 of light sources. Details are available in WO2016012373.

The processing module 8 will further preferably comprise at least one confinement element, mounted onto the main body 9 and made of a material opaque to infrared light and having a confinement face exposed to infrared light (either coming from the same processing module 8 or from another processing module, such as a module 8 of the opposite sidewall 6). The term "confinement" is presently used to encompass two possible optical properties of an element, material or surface: optical reflection; optical absorption. Details are also available in WO2016012373.

It is desired to remove at least part of heat induced by the confinement element, in order to maintain the latter at a temperature. Thermal dissipation from the confinement element(s) (and hence undesired infrared radiation within the cavity 7) is minimized. Thermal fatigue of the confinement element(s), when switching the processing module 8 from a switched off state to an operational state (or vice-versa), is minimized. Thermal inertia of the confinement element(s)—and hence of the processing module 8 and processing unit 1—is minimized when switching the processing module 8 on.

To do so, the (or each) confinement element is mounted on the main body 9, so as to be in thermal contact therewith, whereby thermal regulation of the confinement face is provided by the fluidic circuit 24.

In the depicted example, the processing module 8 comprises several confinement elements.

One confinement element is a reflector frame 44 surrounding the light emitting assembly 21. As illustrated on FIG. 3, the reflector frame 44 has a panel 45 provided with a central opening 46 for the passage of light emitted by the light emitting assembly 21.

The confinement face of the reflector frame 44 is an optically reflecting front face 47 of the panel 45, oriented frontwards.

The reflector frame 44 is preferably made of a thermally conductive material, such as a steel alloy.

The optically reflective properties of the front face 47 may be achieved by a polishing or a coating operation. The front face 47 serves to reflect radiation from the processing modules 8 of the opposite sidewall 6 towards the parisons 2.

The reflector frame 44 is mounted onto the main body 9 and fixed thereto.

In one preferred embodiment, disclosed in FIG. 3, the processing module 8 further comprises a transparent window panel 53 made e.g. of quartz, interposed between the rear face of the reflector frame 44 and the main body 9.

Advantageously, a resilient sealing joint 54 is sandwiched between the window panel 53 and the main body 9 (groove 17).

The window panel 53 and sealing joint 54 provide watertightness to the front housing 15, thereby limiting the risk of pollution of the light emitting assembly 21, due to moisture from air.

In order to withdraw moisture from the front housing 15, it was proposed in WO2016012373 to provide the processing module 8 with a desiccation chamber located on the rear face 11 of the main body 9. The desiccation chamber is filled with dehydration means for preventing each hollow housing from moisture. The dehydration means comprise a source of desiccant defined by a desiccant pad, such as silica gel, in each processing module. The desiccant pad is in fluid communication with the corresponding hollow housing 15 through a fluid feeding circuit defined by inside hole(s) and/or channel(s), in which can typically circulate the cooling fluid issued from the intake nozzle 32. When flowing towards the corresponding hollow housing 15, this cooling fluid is in fluid communication with the source of desiccant, so that a dehydration circuit for preventing each hollow housing from moisture via a dehydrated fluid was defined, within the main body 9. Replacement of the saturated desiccant by fresh desiccant was achieved through a removable cap.

Above details are given for explaining why such a solution is to be improved.

The present invention defines as improvements the following, since using the above removable desiccant pad is considered as no more appropriate.

Instead of including any removable desiccant pad, the dehydration circuit (referenced 59 in FIGS. 5A-5C) is a dynamic circuit, which extends now also outside the main body 9 where, as illustrated, said dehydration circuit 59 can be in fluid communication with a source 55 of fluid. On the dehydration circuit 59 are disposed fluid circulation means 58 and fluid dehydration (or fluid drying) means, referenced 57 and/or 89. The fluid circulation means 58, which can include a pump, forces the dehydrated (or dry) fluid to feed the respective hollow housings 15, within the main body 9.

The dehydration circuit 59 comprises fluid distribution ducts 61 for a fluid communication between the hollow housings 15, so that the dehydrated (or dry) fluid is allowed to circulate towards said hollow housings 15.

The source 55 for delivering this fluid to the processing modules 8 may be a source of air.

Figure 5A:
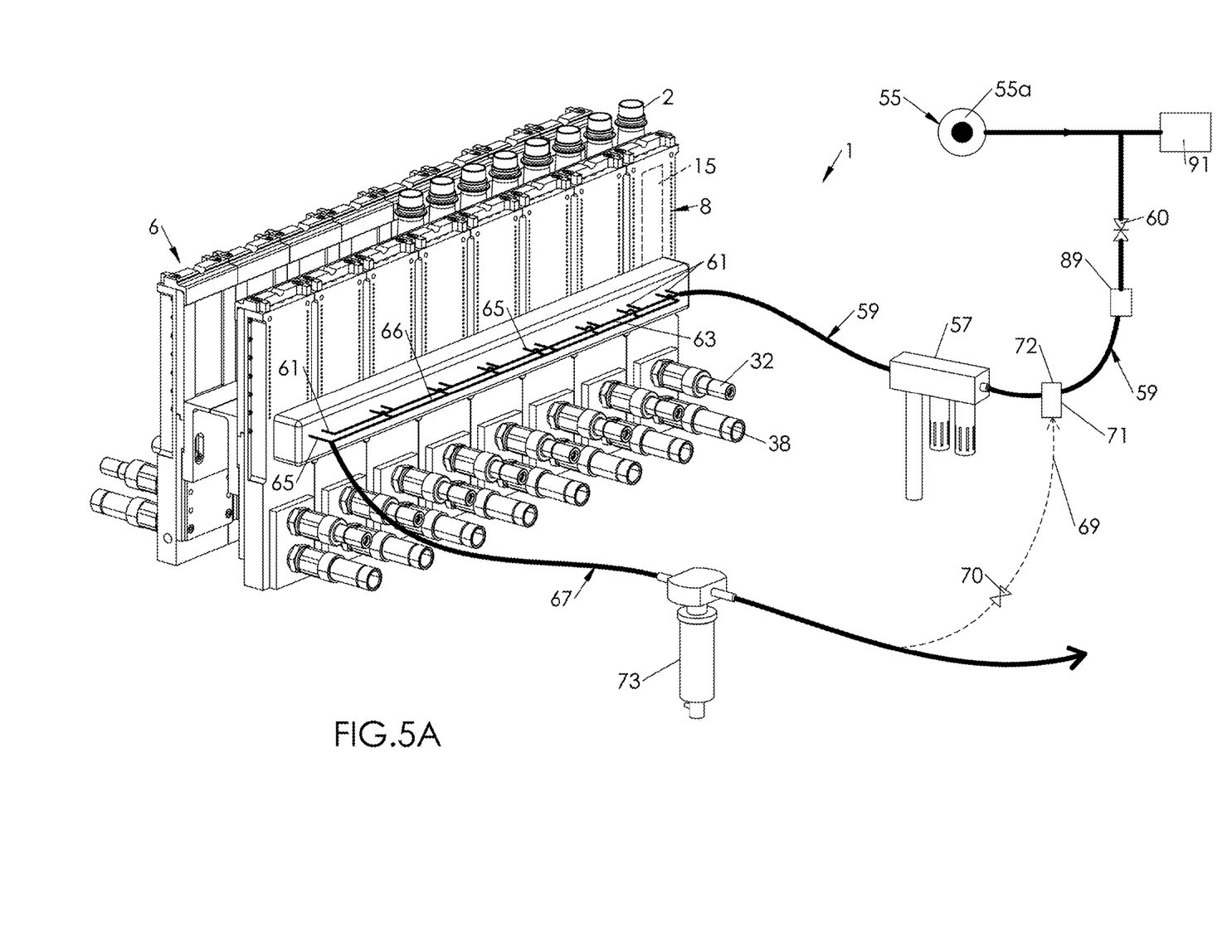
FIGS. 5A, 5B, and 5C respectively correspond to the view of FIG. 1 including means used, in the respective illustrated embodiments, for providing a dried (or dehydrated) fluid to the hollow housings of the processing modules.
Figure 5B:
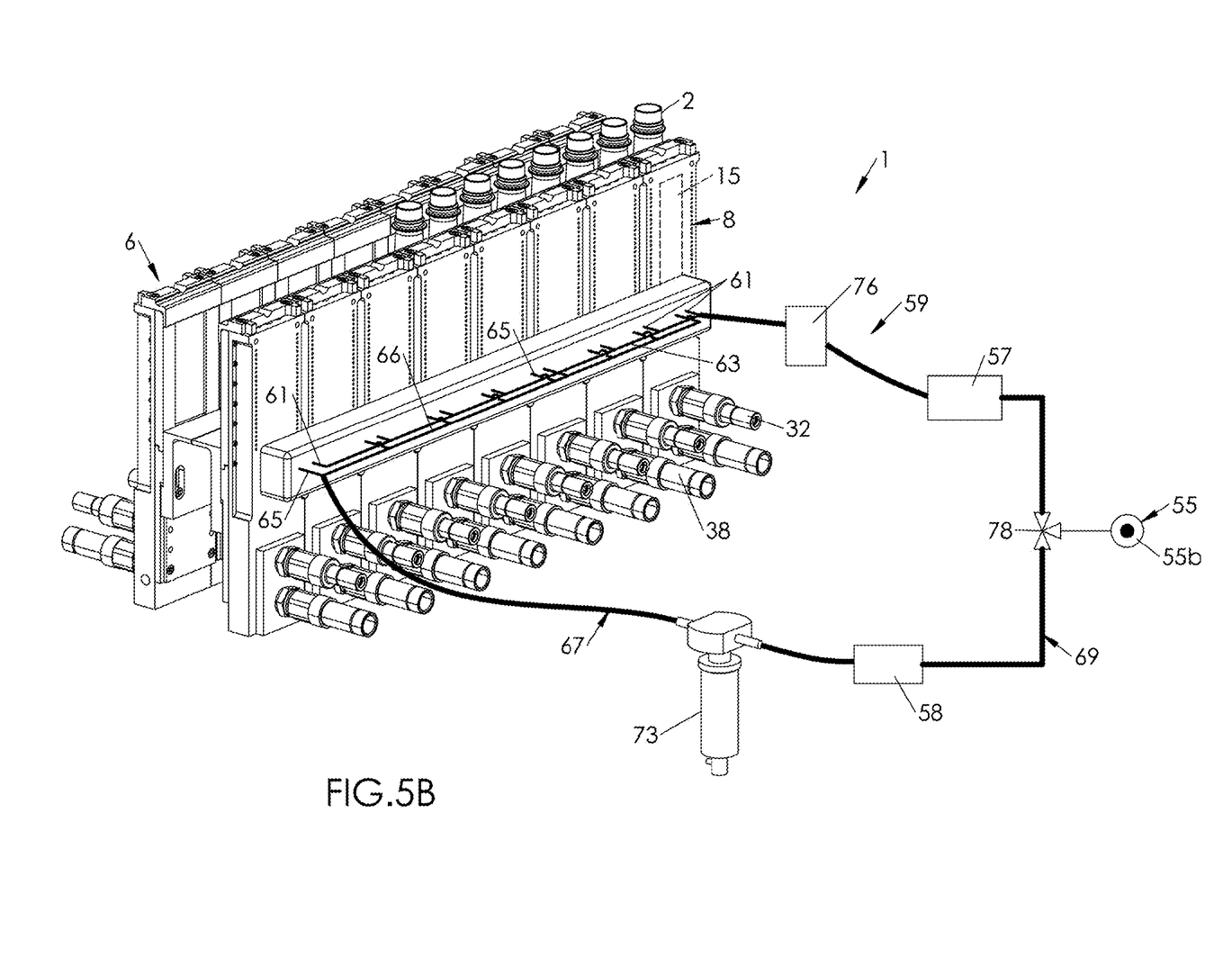
Figure 5C:
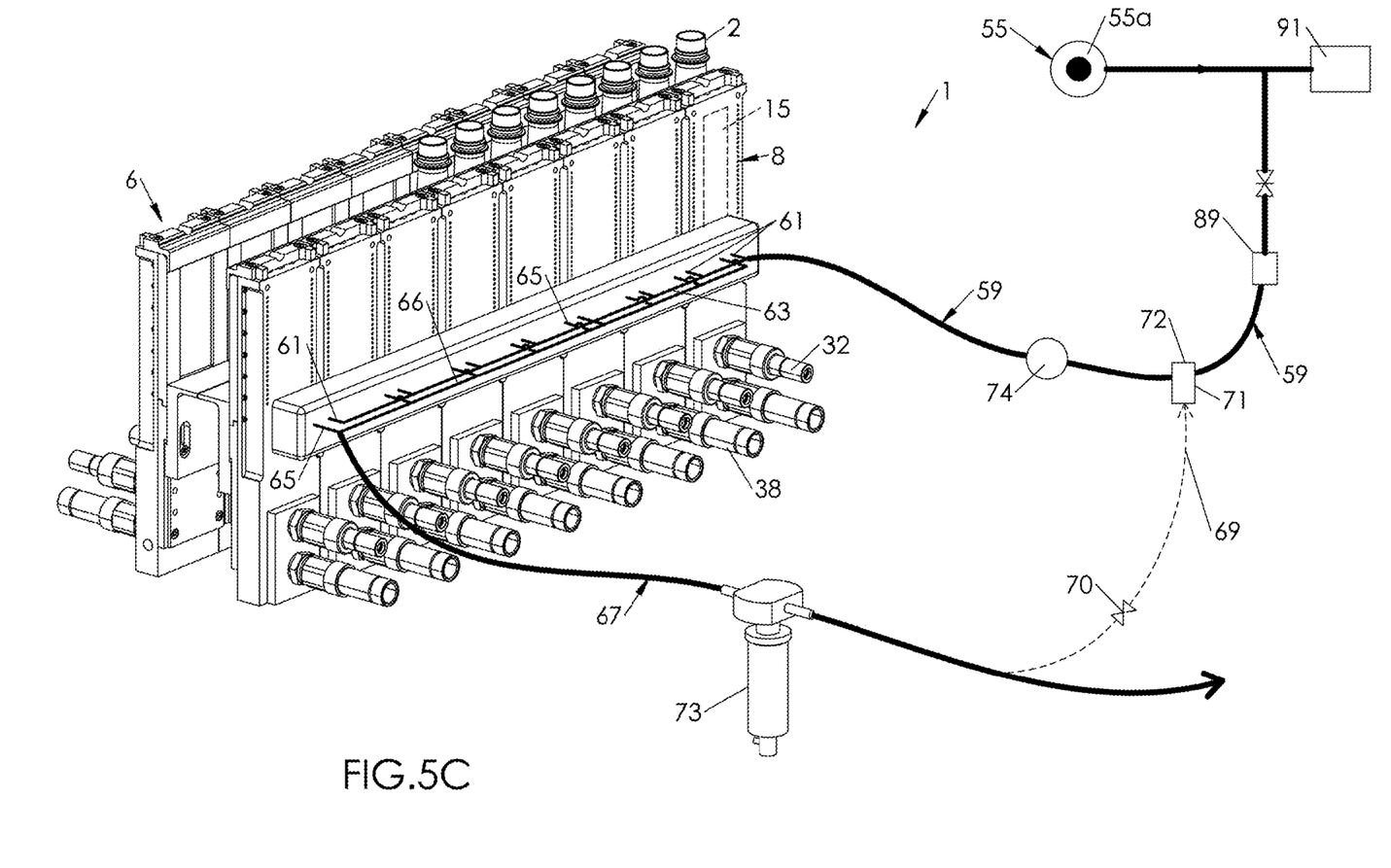

In the embodiments diagrammatically illustrated in FIGS. 5A and 5C, this dehydrated (or dry) fluid is a pressurized fluid issued from the pressurized source 55a. The source 55 delivers the fluid at a first pressure P1. A fluid depressurizing unit 89 is disposed on the fluid dehydration circuit 59 to limit the fluid pressure at a lower (second) pressure P2, adapted to be used in the hollow housings 15.

In these embodiments, source 55a can especially be a source of pressurized dry air used for blowing a fluid (typically air) within the parisons 2 to undergo the above-mentioned blowing or stretch-blowing operation in a mold to form containers such as bottles or flasks.

If so, the source 55a will be in fluid communication with one of a blow molding unit and a stretch blow molding unit 91 fed from said source with a fluid at a pressure adapted for blowing said parisons in said one of the blow molding unit and a stretch blow molding unit.

In that case, a clean—and typically food-grade—fluid, typically air used for blowing fluid within said parisons will be available at a (high) pressure P1, typically about $40 \cdot 10^5$ Pa. The fluid depressurizing unit 89 will then be requested to reduce said high pressure to the reduced pressure P2, typically about $1.5 \cdot 10^5$ Pa. Thus, two successive steps will preferably be requested: $40 \cdot 10^5$ Pa to about 7 to $10 \cdot 10^5$ Pa and then about 7 to $10 \cdot 10^5$ Pa to about $1.5 \cdot 10^5$ Pa.

And when it will be useful to use the pressurized source 55a to feed the fluid dehydration circuit 59, a valve 60 will be opened to allow the pressurized fluid to flow in said circuit 59.

The reduced pressure P2 will be suitable with the above-mentioned preferred embodiment, in which light emitting sources as a matrix 22 are used and a transparent window panel 53 is interposed between the reflector frame 44 and the main body 9, with the sealing joint 54 sandwiched between them, so that a watertightness is applied to the corresponding housing 15.

Further, reducing the pressure from P1 to P2 will have a positive impact on reducing the hygrometry of the fluid.

On another aspect, independently of the pressure of the fluid, for uniformly feeding all the hollow housings 15 with the "same" dehydrated (or dry) fluid having a unique/common moisture ratio, the fluid distribution ducts 61 will preferably be disposed for feeding the processing modules 8 with said fluid in parallel.

In the depicted example illustrated on FIGS. 5A-5C, such a feeding of the all the hollow housings 15 with said fluid in parallel is realized through a distribution manifold 63 disposed on the fluid dehydration circuit 59.

More specifically the distribution manifold 63 is in these preferred examples interposed between the tube of the fluid dehydration circuit 59, which bring the fluid to the main body 9 and the distribution ducts 61, through which the fluid enters said main body.

Preferably, it is better to recover the fluid at an exhaust port 65 of at least one of the hollow housings 15. Said fluid has circulated via the fluid distribution ducts 61 within said hollow housing. The processing modules 8 are, in the depicted examples illustrated on FIGS. 5A-5C, in fluid communication with a fluid exhaust circuit 67, for exhausting the fluid downstream the processing modules.

Each exhaust port 65 is connected to an exhaust manifold 66 interposed between the exhaust ports 65 and the fluid exhaust circuit 67.

Each exhaust port 65 can be in fluid communication with the ambient atmosphere, at the atmospheric pressure. Another solution as depicted in the examples illustrated on FIGS. 5A-5C consists in connecting the fluid exhaust circuit 67 with a fluid recycling circuit 69, which connects the fluid exhaust circuit to the fluid feeding circuit 59. A valve 60 is provided on the fluid recycling circuit 69, which, when opened, allows the recovered fluid to be mixed with the fresh fluid issued from the source 55, so that a more or less closed loop will be realized. When the valve 60 is closed, then the fluid cannot circulate in the fluid recycling circuit 69.

In the embodiment of FIG. 5A, an additional fluid dehydration (or fluid drying) means referenced 57 is optionally provided on circuit 59, downstream from the fluid depressurizing unit 89, which already have a positive impact on the hygrometry of the fluid.

A further connection 71 can be provided, which will preferably be located upstream from the fluid drying means 57, so that the mixed pressurized fluid, which will operate within the hollow housings 15 will be globally further dried or dehydrated there.

Also, a flowmeter 72 can be disposed on both the circuits 59 and 69 for checking the respective flows and thus managing the mixture thereof.

If the dehydrating fluid issued from the hollow housings 15 is recycled, a fluid moisture measurement device 73 will further possibly be disposed on the fluid circuit 67/69 used for exhausting or recycling.

As depicted in the examples illustrated on FIGS. 5A-5C, the fluid moisture measurement device 73 is located outside (downstream) the processing modules 8 to prevent said device from heat and radiations.

In the embodiment of FIG. 5C, the feeding circuit 59 is free of fluid drying means 57. At that location, downstream from the fluid depressurizing unit 89, is provided a particle fluid(air) filter for preventing the hollow housings 15 from particles able to alter their structure.

In the embodiment of FIG. 5B, the processing modules are in fluid communication with the fluid recycling circuit 69, so that said fluid circulates in a closed loop. The fluid recycling circuit 69 put in communication the fluid feeding circuit 59 and the fluid exhaust circuit 67. Consequently, the corresponding closed loop circuit fluid comprises the fluid dehydration means 57 and the fluid circulation means 58. For providing the requested fluid if needed, this circuit can be connected through a valve 78 to a source 55*b* of fluid, which can be opened on the outside air. Said valve 78 can be a three-way valve.

The fluid dehydration means 57 can comprise an air drier.

On the circuit, outside the processing modules 8, there is also provided a pressure relief valve disposed (just) upstream the light emitting assembly 21 for preventing them from an overpressure. Such a pressure relief valve can be disposed on the outside circuit of all the embodiments of FIGS. 5A-5C.

Two embodiments are considered as advantageous to efficiently influence the circulation of the dehydrating pressurized fluid within the hollow housing 15.

Figure 6:
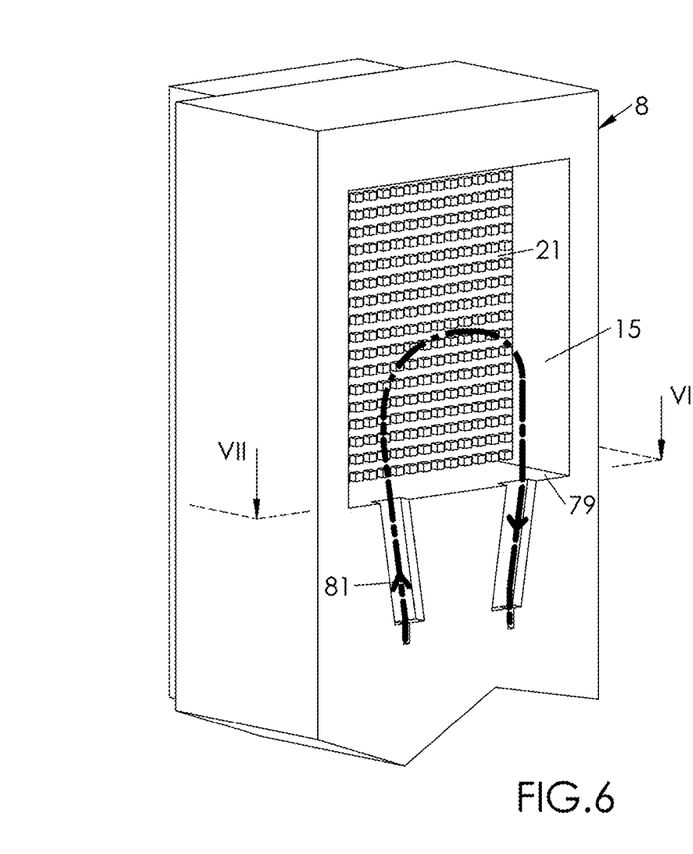
Figure 7:
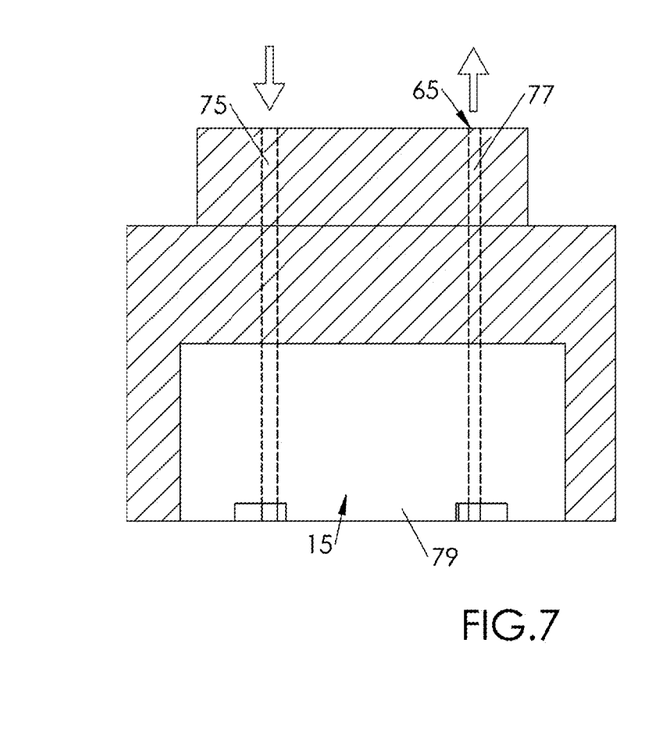

In the first embodiment as illustrated on FIGS. 6, 7, at least some of the hollow housings 15 have through holes 75, 77 located near a common end 79 of said hollow housing for respectively feeding the hollow housing with, and exhausting therefrom, the dried pressurized fluid.

In that case, the light emitting assembly 21 is swept with said fluid from one side. Presently, arrow 81 shows the dehydrating pressurized fluid in circulation as a loop, from the lower end 79, upstream to the light emitting assembly 21, then back to said lower end 79, before being exhausted through hole 77.

Figure 8:
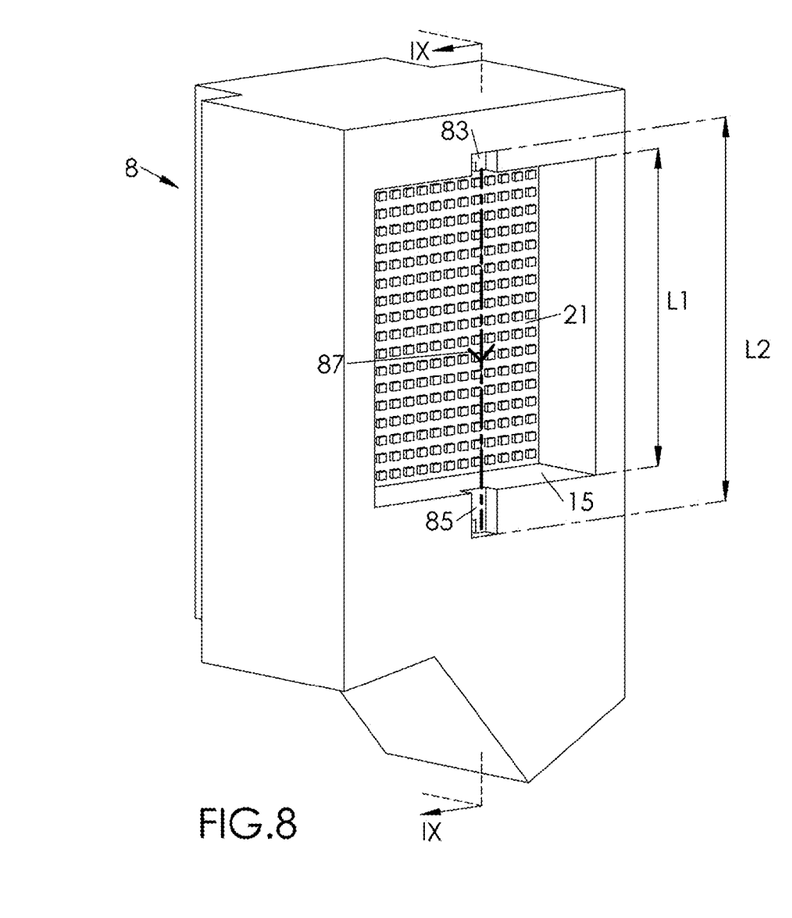
Figure 9:
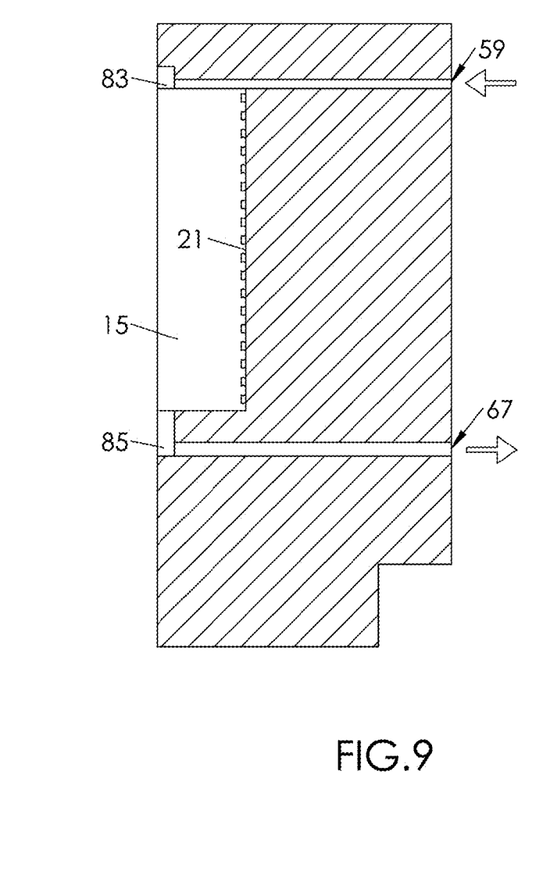

In the second embodiment as illustrated on FIGS. 8, 9, at least some of the hollow housings 15 have through holes 83, 85 located near respectively a top end and a bottom end of the corresponding hollow housing 15.

As in the first embodiment, one of said hole, presently the top hole 83, is in fluid communication with the fluid feeding circuit 59, whereas the other hole, presently the bottom hole 85, is in fluid communication with the fluid exhaust circuit 67.

Further, it can be noted that the light emitting assembly 21 has a length L1, presently vertically oriented. And, each hollow housing 15, within which one light emitting assembly 21 is disposed has a length L2 and two opposite longitudinal ends (the respective top and bottom ends).

In that case, the light emitting assembly 21 is swept with the dehydrating pressurized fluid longitudinally, presently vertically oriented. Arrow 87 shows said fluid in a longitudinal circulation, from the top end, upstream from the light emitting assembly 21, to the bottom end, before being exhausted through hole 85.

In another embodiment, the through holes 83, 85 could be made on the other side of the processing modules 8, as the holes 75, 77, viz. closer to the heating zone, for example near the above-cited coolers.

The invention claimed is:

1. A processing unit (1) for an electromagnetic processing of parisons made of plastic, said processing unit (1) comprising:
a series of adjacent processing modules (8) individually including:
a main body (9) comprising a hollow housing (15),
a light emitting assembly (21) disposed in said hollow housing and including a plurality of light emitting sources,
a fluidic circuit (24) provided within the main body (9) for a thermal regulation of the light emitting assembly (21);
a dehydration circuit (59) for preventing each hollow housing (15) from moisture via a dehydrated fluid,
wherein the dehydration circuit (59) extends outside the main body (9) where the dehydration circuit can be in fluid communication with a source (55) of fluid,
wherein the dehydration circuit (59) is provided with fluid dehydration unit (57, 89) and with fluid circulation unit (55*a*,58) for forcing the dehydrated fluid to feed the respective hollow housings (15).

2. The processing unit of claim 1, wherein the dehydration circuit (59) further comprises fluid distribution ducts (61) disposed for feeding the processing modules (8) with the dehydrated fluid in parallel.

3. The processing unit of claim 1, wherein the processing modules with a fluid exhaust circuit (8) are in fluid communication (67), for exhausting the fluid downstream the processing modules (8).

4. The processing unit of claim 3, wherein the processing modules (8) are in fluid communication with a fluid recycling circuit (69), so that said fluid circulates in a closed loop.

5. The processing unit of claim 4, wherein the fluid recycling circuit (69), in which said fluid circulates in a closed loop comprises the fluid dehydration unit (57) and the fluid circulation unit (58).

6. The processing unit of claim 1, wherein:
the source (55) of pressurized fluid delivers the fluid at a first pressure and,
the fluid dehydration unit and the fluid circulation unit comprise a fluid depressurization device (89) for feeding the respective hollow housings (15) with said dehydrated fluid at a second pressure lower than the first pressure.

7. The processing unit of claim 1, wherein the fluid dehydration unit (57) comprises an air dryer.

8. The processing unit of claim 3, wherein a fluid moisture measurement device (73) is disposed on the fluid exhaust circuit (67) for measuring moisture, downstream the processing modules (8).

9. The processing unit of claim 1, wherein:
the light emitting assembly (21) has a length,
each hollow housing has an upright length with an upper longitudinal end and a lower longitudinal end and,
at least some of the hollow housings (15) include a first through hole (83) located near the upper longitudinal end and a second through hole (85) located near the lower longitudinal end for feeding the first through hole with the dehydrated fluid, and exhausting from the second through hole, said dehydrated fluid, so that the light emitting assembly (21) is swept with said dehydrated fluid longitudinally.

10. The processing unit of claim 1, wherein at least some of the hollow housings (15) have through holes (75, 77) located near a common lower end of said hollow housing for respectively feeding it with, and exhausting therefrom, the dehydrated fluid, so that the light emitting assembly (21) is swept with said fluid from one side.

11. An assembly comprising:
said source (55) of fluid,
one of a blow molding unit and a stretch blow molding unit (91) fed from said source (55) of fluid with a pressurized fluid for blowing said parisons (2) in said one of the blow molding unit and a stretch blow molding unit and,
the processing unit (1) of claim 1.

12. The processing unit of claim 2, wherein the processing modules (8) are in fluid communication with a fluid exhaust circuit (67), for exhausting the fluid downstream the processing modules (8).

13. The processing unit of claim 12, wherein:
the source (55) of pressurized fluid delivers the fluid at a first pressure and,
the fluid dehydration unit and the fluid circulation unit comprise a fluid depressurization device (89) for feeding the respective hollow housings (15) with said dehydrated fluid at a second pressure lower than the first pressure.

14. The processing unit of claim 2, wherein:
the source (55) of pressurized fluid delivers the fluid at a first pressure and,
the fluid dehydration unit and the fluid circulation unit comprise a fluid depressurization device (89) for feeding the respective hollow housings (15) with said dehydrated fluid at a second pressure lower than the first pressure.

15. The processing unit of claim 3, wherein:
the source (55) of pressurized fluid delivers the fluid at a first pressure and,
the fluid dehydration unit and the fluid circulation unit comprise a fluid depressurization device (89) for feeding the respective hollow housings (15) with said dehydrated fluid at a second pressure lower than the first pressure.

16. The processing unit of claim 4, wherein:
the source (55) of pressurized fluid delivers the fluid at a first pressure and,
the fluid dehydration unit and the fluid circulation unit comprise a fluid depressurization device (89) for feeding the respective hollow housings (15) with said dehydrated fluid at a second pressure lower than the first pressure.

17. The processing unit of claim 5, wherein:
the source (55) of pressurized fluid delivers the fluid at a first pressure and,
the fluid dehydration unit and the fluid circulation unit comprise a fluid depressurization device (89) for feeding the respective hollow housings (15) with said dehydrated fluid at a second pressure lower than the first pressure.

18. The processing unit of claim 2, wherein the fluid dehydration unit (57) comprises an air dryer.

19. The processing unit of claim 3, wherein the fluid dehydration unit (57) comprises an air dryer.

20. The processing unit of claim 4, wherein the fluid dehydration unit (57) comprises an air dryer.

* * * * *